(12) United States Patent
Kou et al.

(10) Patent No.: US 6,246,175 B1
(45) Date of Patent: Jun. 12, 2001

(54) LARGE AREA MICROWAVE PLASMA GENERATOR

(75) Inventors: Chwung-Shan Kou; Tsang-Jiuh Wu, both of Hsinchu (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/426,045

(22) Filed: Oct. 25, 1999

(51) Int. Cl.$^7$ .............................. H01J 7/24; H05B 31/26
(52) U.S. Cl. .................. 315/111.21; 315/111.51; 315/111.81; 118/723 MW; 118/723 IR
(58) Field of Search .................... 315/111.21, 111.51, 315/111.81; 118/723 MW, 723 IR

(56) References Cited

U.S. PATENT DOCUMENTS 3,814,983   6/1974   Weissfloch .

FOREIGN PATENT DOCUMENTS

0431951  *  6/1991  (EP) .
62-99481     5/1987  (JP) .

\* cited by examiner

*Primary Examiner*—Michael B Shingleton
(74) *Attorney, Agent, or Firm*—Jackson Walker L.L.P.

(57) ABSTRACT

A plasma generator is composed of a surface wave resonant cavity and a vacuum cavity. A microwave energy is introduced into the surface wave resonant cavity via a couple hole of the surface wave resonant cavity, thereby causing the surface wave resonant cavity to resonate to bring about an electromagnetic surface wave, which is then guided into the vacuum cavity via a large area quartz or ceramic couple window located at the top of the vacuum cavity, so as to result in the production of a large area planarized plasma by a low pressure gas contained in the vacuum cavity.

23 Claims, 7 Drawing Sheets

LARGE AREA MICROWAVE PLASMA GENERATOR

FIELD OF THE INVENTION

The present invention relates generally to a microwave plasma generator, and more particularly to the microwave plasma generator capable of producing a large area planarized plasma.

BACKGROUND OF THE INVENTION

The large area plasma source has become an important tool for making a semiconductor and treating a material. The methods currently used for generating plasma include the DC discharge method, the RF discharge (13.6 MHz) method, and the microwave discharge (2.45 GHz) method. The DC discharge and the RF discharge methods are generally grouped into the capacitor-couple and the inductor-couple. The microwave discharge method involves the non-magnetic field microwave discharge and the magnetic field ECR. The radio frequency discharge method is most widely used in the process of making a semiconductor.

There are several advantages in using the microwave to generate the plasma in view of the fact that the plasma produced by the microwave has a higher plasma density and a higher ionization ratio, and that the quantities of the activated molecule and chemical radical are much greater in the microwave plasma than in the radio frequency plasma, and further that the microwave plasma is generated without the use of an electrode, and still further that the potential of the microwave plasma sheath is relatively low so as to minimize the pollution problem. It must be noted here that the microwave plasma can play an important role in the material treatment in light of the microwave plasma which contains the activated molecule and chemical radical in quantity.

In spite of the advantages of the microwave plasma, the microwave plasma is not used in the industrial application as often as the radio frequency plasma. The reason is that it is technically difficult to produce a large volume microwave plasma for industrial application. Such a technical difficulty as described above is attributable to the short wavelength of the microwave as well as the limited capability of the microwave to penetrate the plasma. The process of producing a large volume plasma calls for the use of the waveguide tube or the resonant cavity, which has a dimension greater than the wavelength of the microwave and the penetration depth of the microwave. As a result, the production of the plasma is convaneed to the position at which the microwave is introduced into the vacuum cavity, without the formation of the large volume plasma. In fact, the treatment of wafer in the process of making a semiconductor is carried out by the large area plasma, not by the large volume plasma. For this reason, the primary objective of the present invention is to provide a generator capable of producing a large area planarized plasma.

Weissfloch, et al. disclose in the U.S. Pat. No. 3,814,983 an apparatus for plasma generation by using a electromagnetic energy in the microwave frequency range, having a source of microwave energy, a strapped-bar slow wave structure, conveying means for conveying microwave energy from the source to the slow wave structure, and a plasma container. The vacuum reaction cavity is formed of a quartz tube having a diameter of 19 mm. As a result, this design is not suitable for treating a large area chip. Because of the use of the in-progress wave reactor, the power can not be completely used to excite the plasma. It is necessary to connect the rear end of the slow wave structure with a matching load to absorb the residual microwave power. As a result, the utilization rate of the power is relatively low. In addition, energy is used to excite the plasma at the time when the in-progress wave reaction is under way and when the microwave is moving forward. Therefore, the microwave power diminishes as the microwave moves forward. In order to attain a uniform plasma, the vacuum reaction cavity and the slow wave structure must be kept at a constant inclination, which must be adjusted in accordance with the operational conditions.

Komachi and Kobayashi disclose in the Japanese Patent 62-99481 a microwave plasma machine for treating a large area chip. The microwave structure is formed of a platelike slow wave structure made of Teflon (polytetrafluoroethylene). A large metal vacuum cavity is provided at the top thereof with a microwave window formed of a large area quartz plate. The microwave power is introduced via the microwave window from the slow wave structure into the vacuum cavity so as to excite the plasma. The main drawback is the slow wave structure which is made of polytetrafluoroethylene and is limited in the transmission of the large power microwave and in the heat resistance. In light of the application of the in-progress wave reaction, the electric field density so brought about is not as great as the electric field density brought about by the resonant cavity.

SUMMARY OF THE INVENTION

The primary objective of the present invention is to provide a large area microwave plasma generator, which is based on two physical schemes described hereinafter.

The first scheme is that the microwave power required for discharge is distributedly coupled over the desired plasma area. The second scheme is to separate the main microwave propagation structure from the plasma production region, and thus a distribution-type of microwave coupling is able to be accomplished.

The microwave transmission structure is in fact a surface wave resonant cavity formed of a periodic vane-type slow wave structure. A planarized microwave energy is introduced into the surface wave resonant cavity. In other words, the microwave is transmitted in the form of the surface wave. The surface wave resonant cavity is disposed on the vacuum cavity which serves as a plasma producing region. The microwave energy is introduced into the vacuum cavity via a coupled window located in the top of the vacuum cavity, so as to excite the plasma. As a result, a large area planarized plasma is produced.

The large area microwave plasma generator of the present invention is composed of a surface wave resonant cavity mechanism and a vacuum cavity used in producing plasma.

The surface wave resonant cavity mechanism consists of a flat plate which is provided in one surface thereof with a plurality of vertical vanes parallel to one another. Located in proximity of a first vertical vane is an inlet plate which is provided with a couple hole for receiving a microwave energy. Located in proximity of a last vertical vane is a tail end plate. Both the inlet plate and the tail end plate are perpendicular to the flat plate. Both the inlet plate and the tail end plate have an upright height greater than the upright height of the vertical vanes.

The vacuum cavity is connected with a pumping mechanism and a gas supplying mechanism which is intended to provide gas for producing plasma. The vacuum cavity is therefore capable of forming therein a pressure-reduced atmosphere containing the gas. The vacuum cavity is provided in a wall thereof with a planarized couple window. The microwave energy is introduced into the surface wave resonant cavity mechanism via the couple hole such that the microwave energy is resonated to bring about an electromagnetic surface wave. The electromagnetic surface wave passes the couple window to result in the production of a plasma by the gas in the vacuum cavity.

Preferably, the surface wave resonant cavity mechanism is a periodic vane-type slow wave structure, in which the period of the slow wave structure, the upright height of the vertical vanes and the distance between two adjoining vanes must be such that the resonance of the microwave energy is effected in the slow wave structure. The definition of the period of the slow wave structure is a sum of thickness of one vertical vane and the distance between two adjacent vanes. The slow wave structure has a predetermined number (n) of periods. The number "n" is a positive integer and is preferably 12. Preferably, the resonance frequency is 2.45 GHz. Preferably, the microwave energy is excited by the slow wave structure such that the microwave energy exists at π mode. Preferably, the entire period of the slow wave structure is arranged in series by a half period, n−1 number of periods, and a half period.

The slow wave structure of a preferred embodiment of the present invention has a period of 4.9 cm. The upright height of the vertical vanes is 1.35 cm. The distance between two adjoining vertical vanes is 3.92 cm.

Preferably, the resonance frequency of the surface wave resonant cavity mechanism is adjustable. The upright height of the vertical vanes is preferably adjustable. The surface wave resonant cavity mechanism is preferably composed of a plurality of interval strips which are fastened equidistantly on the surface of the flat plate. A slide slot is formed in the interval strips, the inlet plate and the tail end plate. A slide plate is slidably disposed in the slide slot such that the slide plate is capable of moving in a direction perpendicular to the surface of the flat plate. An adjustment mechanism is provided for adjusting the vertical distance between the slide plate and the flat plate. The vertical vanes are disposed one by one in the intervals formed by the interval strips such that the vertical vanes are fastened securely with the slide plate. The upright height of the vertical vanes can be thus adjusted by the adjustment mechanism.

Preferably, the adjustment mechanism consists of a threaded rod and a nut engageable with the threaded rod, which is formed in a through hole of the flat plate. The threaded rod has one end which is fastened with the slide plate via the through hole. The threaded rod has another end which is engaged with the nut. The nut is rotatably confined by a stopping plate which is separated from the flat plate by a distance.

Preferably, the large area microwave plasma generator of the present invention is further composed of a microwave coupler, which is provided at one end thereof with a coupling mouth covering the couple hole of the inlet plate. A microwave energy source is located at another end of the microwave coupler such that the microwave energy is introduced into the couple hole of the inlet plate.

Preferably, the couple hole of the inlet plate has a rectangular shape, whereas the microwave coupler has a lead wave tube having a rectangular cross section. The rectangular couple hole has two opposite sides which are parallel to the surface of the flat plate. The lead wave tube has an inclined inner wall. The height of the rectangular cross section of the lead wave tube is progressively reduced from another end of the lead wave tube toward the couple mouth such that the size of the couple mouth is substantially equal to the couple hole of the inlet plate.

The large area microwave plasma generator of the present invention may be further composed of a microwave energy source capable of generating a microwave having a frequency of 2.45 GHz.

Preferably, the distance (height) of the two opposite sides of the rectangular couple hole is 1.0 cm, whereas the distance between another two opposite sides of the rectangular couple hole is a half wavelength.

Preferably, the upright height of the vertical vanes is greater than a side of the couple hole, with the side of the couple hole being farthest from the surface of the flat plate. More preferably, the upright height of the vertical vanes is equal to a side of the couple hole, with the side of the couple hole being farthest from the surface of the flat plate.

The large area microwave plasma generator of the present invention may be still further composed of a microwave radiation shield mechanism circumventing the surface wave resonant cavity mechanism. Preferably, the microwave radiation shield mechanism consists of four metal plates, which are so arranged as to form a rectangular wall circumventing the vertical vanes, the inlet plate and the tail end plate. Two opposite metal plates of the four metal plates are provided with a plurality of ventilation holes for the passage of the cooled air.

Preferably, the couple window is made of a single piece of or two side-by-side pieces of a material of low microwave energy consumption such as quartz or ceramics, preferably the quartz.

The large area microwave plasma generator of the present invention is still further composed of a cooling mechanism capable of providing the cooled air.

The foregoing features, functions and advantages of the present invention will be more readily understood upon a thoughtful deliberation of the following detailed description of the present invention with reference to the accompanying drawings.

DETAILED DESCRIPTION OF THE INVENTION

Figure 1:
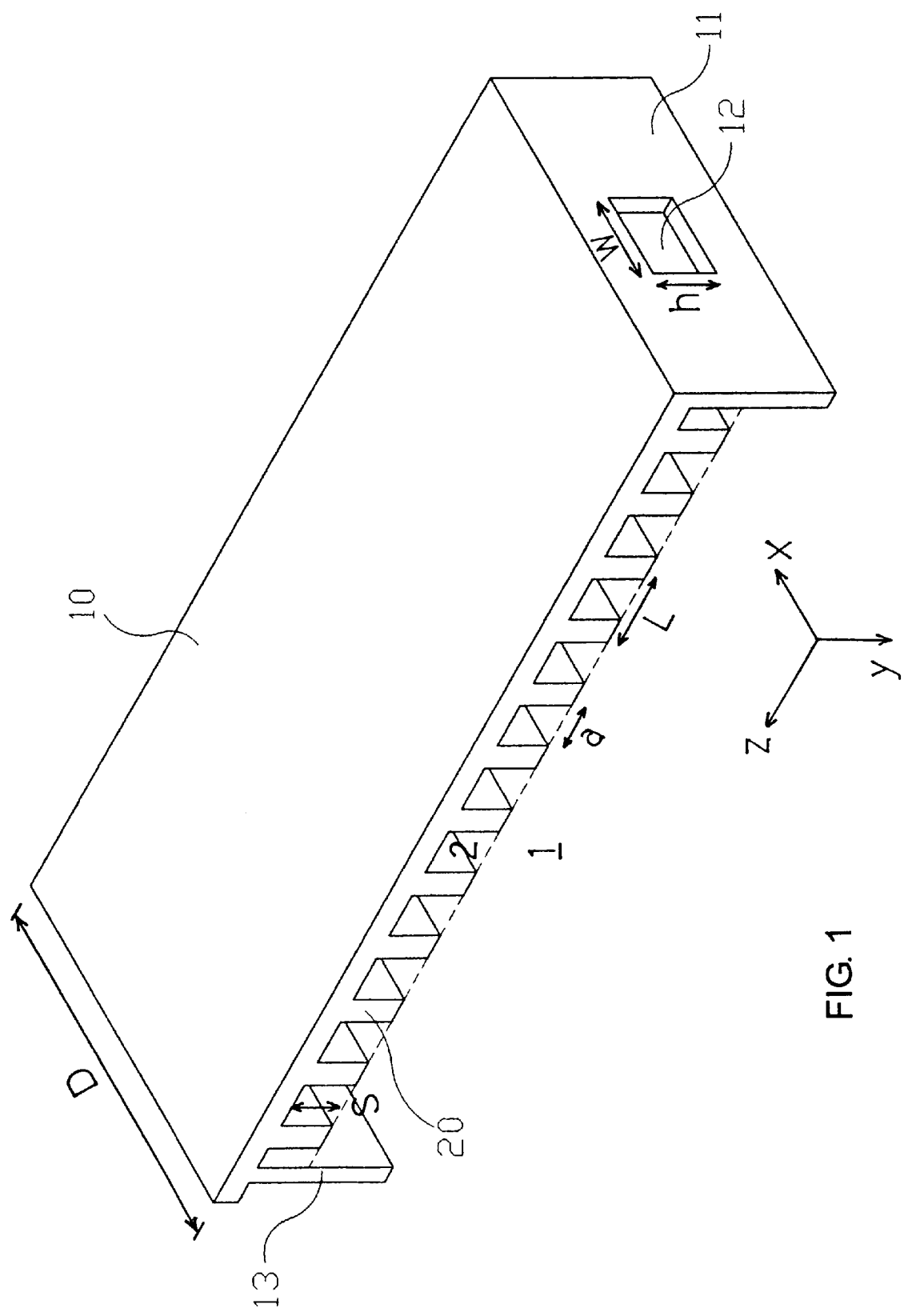
FIG. 1 shows a schematic perspective view of the surface wave resonant cavity formed of a periodic vane-type slow wave structure.

As compared with the capacitor-couple radio frequency plasma, the microwave plasma (2.45 GHz) has higher plasma density and ionization ratio. In addition, the microwave is relatively more efficient in producing the activated molecule. However, it is extremely difficult to produce a large volume plasma to provide a large area material treatment. The reason is that the microwave has a short wavelength, and that the penetration of the microwave into the plasma is shallow. The objective of the present invention is attained by exciting the planarized large area plasma. The present invention is based on two concepts of physics. One of the two concepts is related to the distribution-type microwave couple, whereas another one of the two concepts is related to the separation of the plasma producing region from the microwave main transmission structure. In light of these two concepts, the present invention discloses a surface wave resonant cavity which is formed of a periodic vane-type slow wave structure and is used as a microwave transmission structure, as shown in FIG. 1. The microwave transmission structure is capable of transmitting microwave in the form of surface wave. In other words, the power of the microwave is mainly confined to a second area of FIG. 1, with the microwave power being greatest in the vane-type structure surface (the x-z plane located at the junction of the first area and the second area) such that the microwave power diminishes exponentially in the y direction. The present invention makes use of this physical characteristic to bring about the planarized expansion of the microwave energy.

As shown in FIG. 1, a surface wave resonant cavity embodied in the present invention consists of a flat plate 10 which is provided in a surface thereof with twelve vertical vanes 20 parallel to one another, an inlet plate 11 contiguous to the first one of the vertical vanes 20 and having a rectangular couple hole 12 suitable for receiving a microwave energy, and a tail end plate 13 contiguous to the last one of the vertical vanes 20. The inlet plate 11 and the tail end plate 13 are perpendicular to the flat plate 10 and have an upright height greater than the upright height of the vertical vanes 20. The inlet plate 11, the tail end plate 13 and the vertical vanes 20 have a width (D) of 25 cm. The height (h) of the couple hole 12 is 10.0 mm, whereas the width (w) of the couple hole 12 is half wavelength. The surface wave resonant cavity of the present invention is composed of twelve periodic vane-type slow wave structures in which a plurality of resonant modes can exist. The present invention makes use of the $\pi$ mode. The phase difference is 180° when the microwave passes each period. In order to assure the integrity of the periodicity, both sides of the resonant cavity are provided respectively with an additional half period. In other words, there are eleven periods between the leftmost half period and the rightmost half period. As a result, the space distribution of the microwave electromagnetic field can be kept unchanged in each period. The design parameters of the vane-type structure include period (L), the height (s) of each tooth, and the distance (a) between teeth. In the preferred embodiment of the present invention, the parameters include the period (L) of 49.0 mm, the distance (a) of 39.2 mm, and the height (s) of 13.5 mm.

Figure 2:
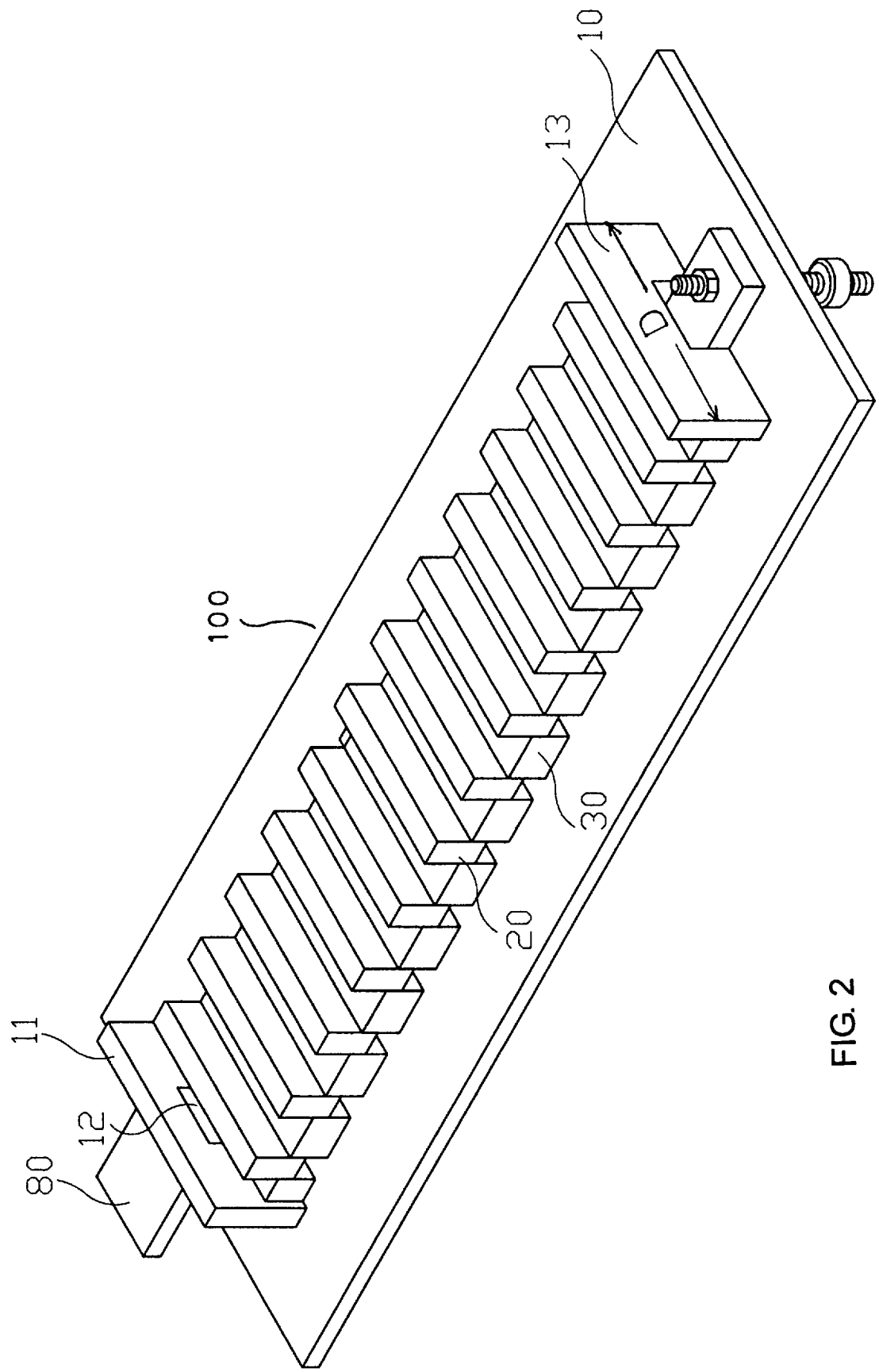
FIG. 2 shows a schematic perspective view of an adjustable surface wave resonant cavity.
Figure 3:
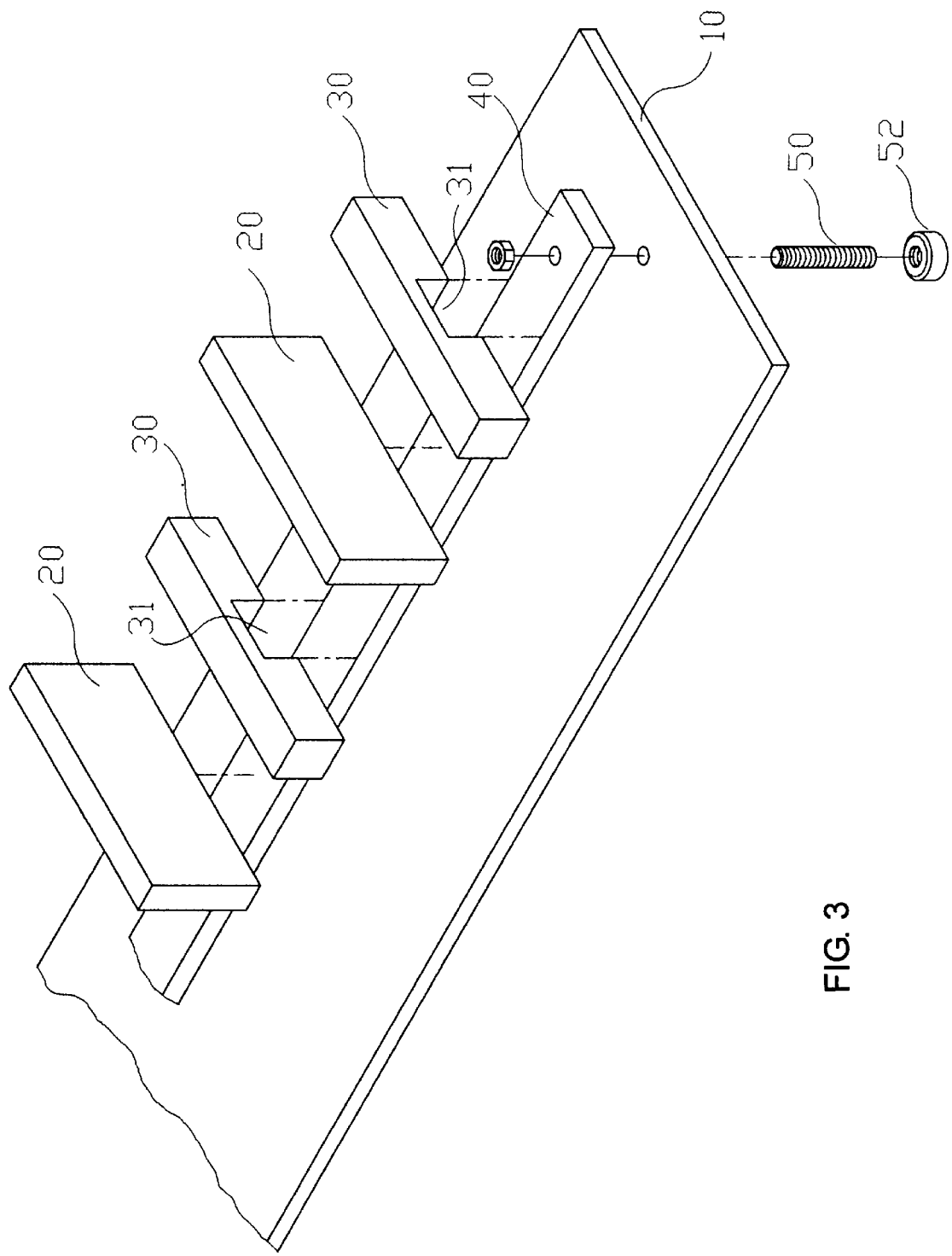
FIG. 3 shows a schematic perspective view of the adjustable surface wave resonant cavity of FIG. 2, with portion of the component elements of the adjustable surface wave resonant cavity being separated in proper sequence.
Figure 4:
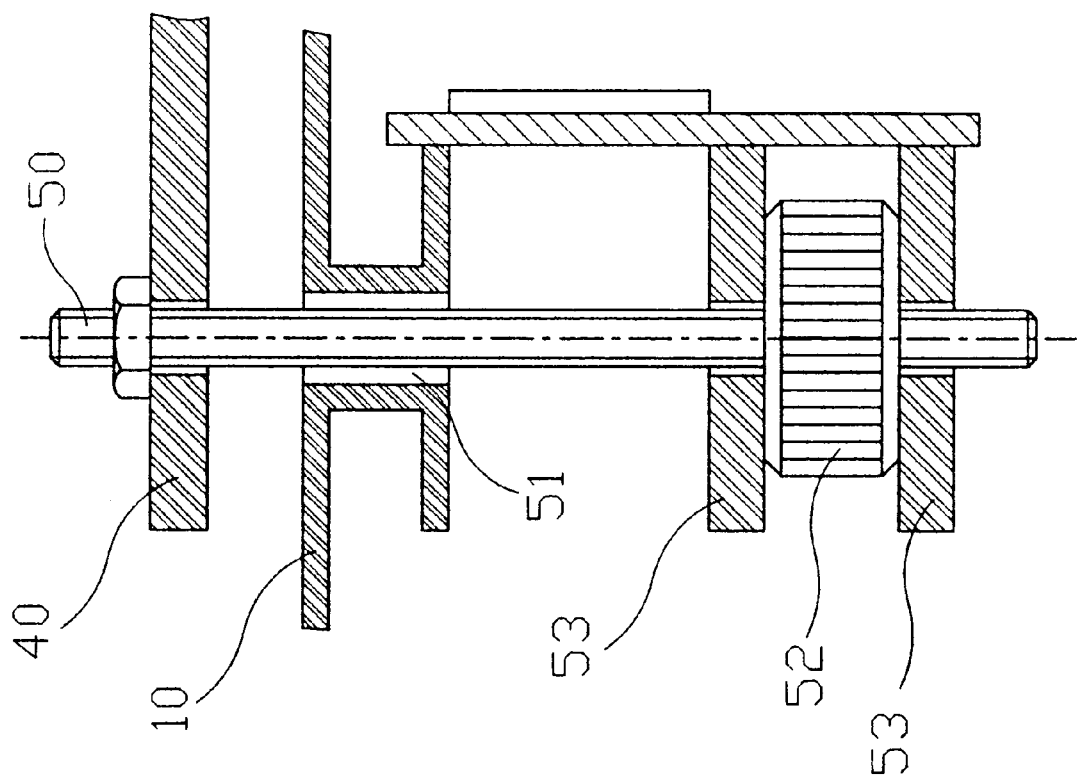
FIG. 4 shows a partial sectional view of an adjustment mechanism used to adjust the vertical distance between the slide plate and the flat plate of FIG. 2.

In view of the fact that the resonance frequency of the resonant cavity can be altered by the errors in generating the plasma and in manufacturing the slow wave structure, the resonance frequency of the surface wave resonant cavity shown in FIG. 1 is preferably adjustable so as to attain resonance with the frequency (2.45 GHz) of a microwave energy source. From the theoretical analysis, it is known that the resonance frequency is the unit adjustment function of the tooth height of the resonance frequency. As shown in FIGS. 2–4, an adjustable surface wave resonant cavity 100 embodied in the present invention consists of thirteen interval strips 30 which are fastened equidistantly with the surface of the flat plate 10. A slide slot 31 is formed in the interval strips 30, the inlet plate 11 and the tail end plate 13. A slide plate 40 is slidably disposed in the slide slot 31 such that the slide plate 40 is perpendicular to the surface of the flat plate 10. The vertical vanes 20 are disposed one by one in the intervals formed by the interval strips 30 such that the vertical vanes 20 are fastened with the slide plate 40. The vertical distance between the flat plate 10 and the slide plate 40 is adjusted by an adjustment mechanism consisting of a threaded rod 50, a through hole 51 provided on the flat plate 10, and a nut 52. The threaded rod 50 is received in the through hole 51 of the flat plate such that one end of the threaded rod 50 is fastened with the slide plate 40, and that another end of the threaded rod 50 is engaged with the nut 52 which is rotatably confined between two fixed stopping plates 53. The frequency adjustment is thus attained by rotating the nut 52 so as to adjust the distance between the vertical vanes 20 and the upright height of the surface of the flat plate.

Figure 5:
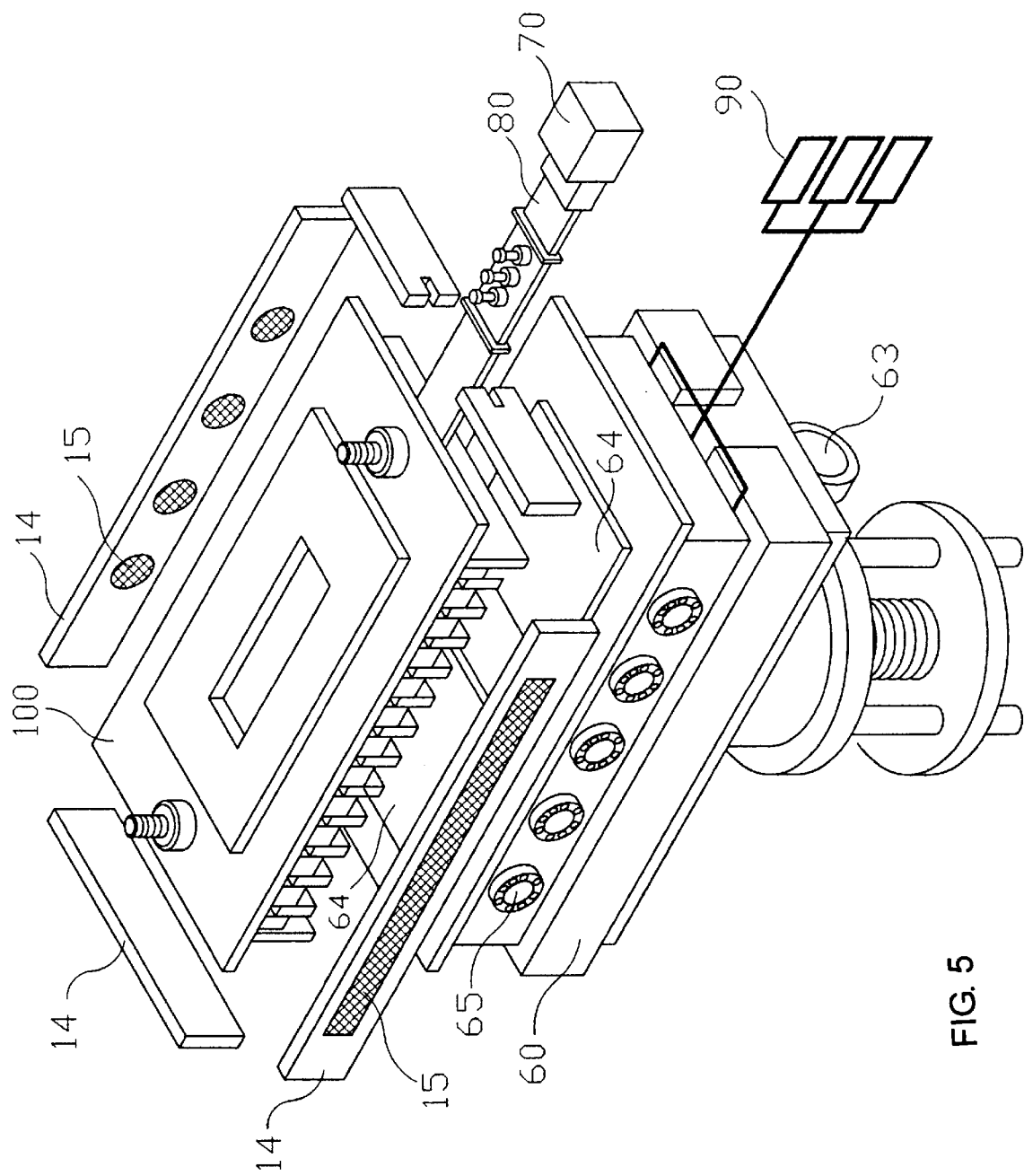
FIG. 5 shows a schematic perspective view of the large area microwave plasma generator of the present invention making use of the adjustable surface wave resonant cavity shown in FIG. 2.
Figure 6:
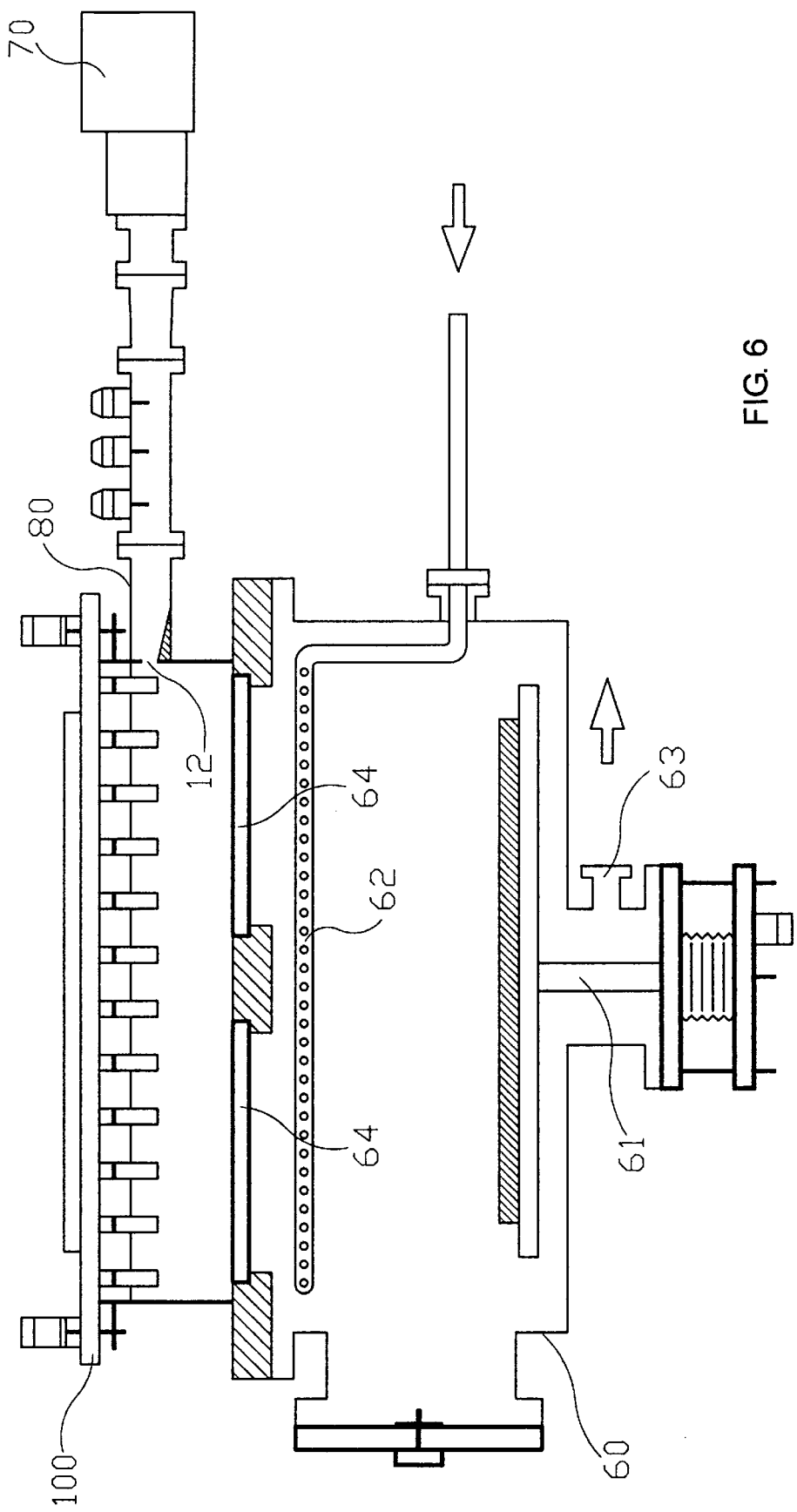
FIG. 6 shows a partial sectional view of the large area microwave plasma generator shown in FIG. 5.
Figure 7:
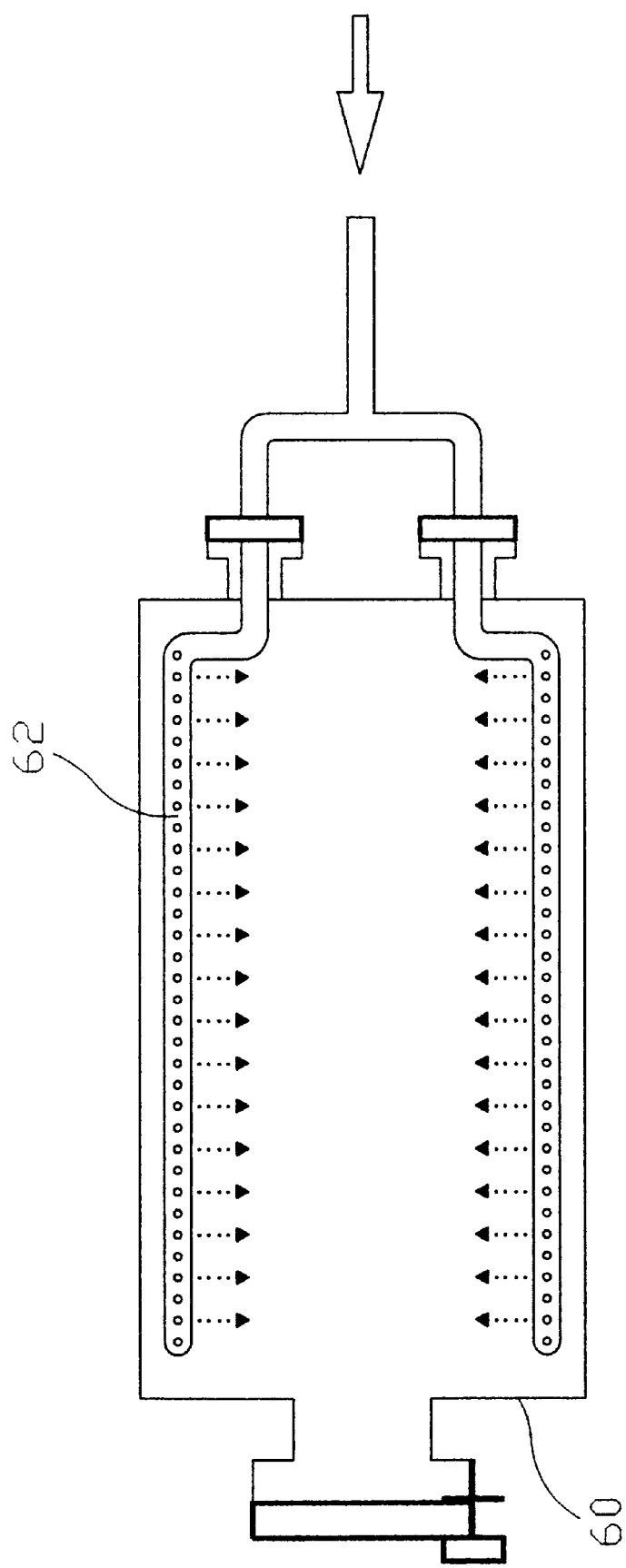
FIG. 7 shows a schematic top view of a vacuum cavity 60 with a transparent top, and a gas supply channel 62 of the vacuum cavity 60.

As shown in FIGS. 5 and 6, a large area microwave plasma generator of the present invention makes use of the adjustable surface wave resonant cavity 100 of FIG. 2 and consists of a rectangular vacuum cavity 60 which is made of an aluminum or stainless steel material and composed of a movable platform 61 for supporting wafer, and a gas supplying channel 62 formed of two stainless steel tubes. The gas supplying channel 62 is located in proximity of the upper portions of two side walls, as shown in FIG. 7. The stainless steel tubes are provided with a number of pores which are arranged equidistantly. The vacuum cavity 60 is provided in the bottom thereof with a pumping port 63 in communication with a vacuum pumping system. The gas flow and the gas pressure are regulated respectively by a flow controller 90 and a pressure controller (not shown in the drawing). The vacuum cavity 60 is provided in the top thereof with two identical openings of a square shape. Each of the two openings is hermetically fastened with a couple window 64 made of a wear-resistant medium, such as quartz plate. Located over the vacuum cavity 60 is the adjustable surface wave resonant cavity 100, into which a microwave is introduced via a microwave coupler 80 from a microwave energy source 70 capable of generating a 2.45 GHz microwave. The microwave so introduced is capable of exciting the resonant mode of the $\pi$ mode. The microwave is introduced via the quartz window 64 into the vacuum cavity 60 to excite plasma. The microwave window is cooled by the circulating air provided by a fan.

As shown in FIG. 5, the surface wave resonant cavity 100 is surrounded by a microwave shield mechanism 14 made of four metal plates. The front and the rear metal plates are provided with a plurality of ventilation holes 15. The quartz window 64 is cooled by the cold circulating air provided by an air conditioning mechanism (not shown in the drawings).

The vacuum cavity is further provided in the front wall thereof with a plurality of view windows 65 through which the plasma production can be observed.

The microwave coupler 80 is composed of a WR-284 waveguide tube having a rectangular cross section and is provided at one end thereof with a couple port covering the couple hole 12 of the inlet plate. The microwave is guided into the couple hole 12 of the inlet plate from the microwave energy source 70, as shown in FIGS. 5 and 6. The rectangular waveguide tube 80 has an inclined inner wall and a cross-sectional height decreasing gradually from another end thereof. The couple port is substantially equal in size to the couple hole 12 of the inlet plate.

The advantages of the present invention are described hereinafter.

The present invention is capable of producing a large area plasma having a high density and an excellent uniformity. The present invention makes use of the surface wave resonant cavity to excite the π mode surface wave so as to planarize the microwave energy. Thereafter, the microwave energy is introduced into the vacuum cavity to excite the plasma production by means of the distribution type coupling. As a result, the present invention is capable of producing the large area plasma of an excellent uniformity. In addition, the experimental result shows that this method can excite the "surface wave" of the plasma so as to produce the plasma of a density higher than $10^{12}\#/cm^3$.

The plasma source of the present invention can be scaled up. The plasma source can not be easily scaled up from small size to large size. The present invention makes use of the π mode surface wave of the periodic vane-type structures such that the number of period is increased without changing the resonance frequency and the space distribution of the microwave electromagnetic field, and that the area of the resonant cavity is enlarged. In addition, the present invention is capable of producing the planarized plasma source, not the volumetric plasma source. The scaling up of the area has little influence on the particle diffusion of the plasma.

The present invention makes it possible to treat temperature of the wafer as an independent parameter of the production process. In the process of making a semiconductor material, the temperature of the wafer is a very important control parameter. In view of the face that the present invention makes use of the surface wave, the microwave diminishes exponentially in the vacuum cavity. In addition, a shielding effect is brought about at the time when the production of the planarized plasma takes place. As a result, the heating effect of the microwave on the wafer is minimized. For this reason, the present invention is capable of changing the plasma density by increasing or decreasing the microwave power, without changing the temperature of the wafer.

The present invention is capable of enhancing the efficiency of the microwave power. The present invention makes use of the resonant cavity instead of the progressive wave structure. As a result, the microwave power is fully used. In addition, a greater electric field density is brought about by the resonant cavity rather than the progressive wave structure. For this reason, the resonant cavity is more effective than the progressive wave structure in exciting the plasma. Moreover, the present invention makes use of the π mode resonance capable of producing the highest the electric field density among all the resonance modes.

As compared with the Komachi's slow wave structure of polytetrafluoroethylene (PTFE), the resonant cavity of the metal slow wave structure of the present invention is relatively more effective in bearing the microwave power. In other words, the present invention is capable of withstanding a relatively greater microwave power and is therefore capable of producing the large area plasma having a relatively high density. In addition, the present invention is relatively more heat-resistant than the prior art structure.

The present invention is capable of an uniform micro-adjustment of the resonance frequency of the resonant cavity. The uniform micro-adjustment is attained by changing the height of each of the vertical vanes in place of the prior art technique of inserting a metal bar or dielectric article to attain a micro-interfering resonant cavity. As a result, the electromagnetic field brought about in the resonant cavity of the present invention is uniformly distributed.

The experimental results show that the present invention is capable of exciting 25 cm_50 cm plasma with 10% uniformity and a density as high as $10^{12}$ cm$^{-3}$. The present invention is applicable to the treatment of a wafer having an area of 8 inches, 12 inches, or greater. In addition, the density of the plasma produced by the present invention is much higher than that of the capacitance-type radio frequency plasma. The present invention is therefore capable of treating the semiconductor material more efficiently and is more competitive than the prior art in terms of economic potential.

What is claimed is:

1. A large area microwave plasma generator comprising:
   a surface wave resonant cavity mechanism consisting of a flat plate provided in a surface thereof with a plurality of vertical vanes parallel to one another, said mechanism further consisting of an inlet plate contiguous to a first vertical vane of said vertical vanes, said inlet plate having a couple hole suitable for receiving a microwave energy, said mechanism still further consisting of a tail end plate contiguous to a last vertical vane of said vertical vanes, said inlet plate and said tail end plate being perpendicular to said surface of said flat plate and having an upright height greater than an upright height of said vertical vanes; and
   a vacuum cavity used to produce plasma and connected with a pumping mechanism and a gas supplying mechanism for providing said vacuum cavity with gas for producing said plasma, said vacuum cavity provided in a wall thereof with a flat couple window facing said vertical vanes, said surface wave resonant cavity mechanism capable of generating an electromagnetic surface wave at the time when a microwave energy is introduced via said couple hole into said surface wave resonant cavity mechanism, said electromagnetic surface wave being introduced via said couple window into said vacuum cavity to cause said gas to produce a plasma in said vacuum cavity.

2. The generator as defined in claim 1, wherein said surface wave resonant cavity mechanism is a periodic vane-type slow wave structure having a period, the upright height of said vertical vanes and the distance between two adjoining vertical vanes to enable said microwave energy to attain resonance in said slow wave structure.

3. The generator as defined in claim 2, wherein said resonance has a frequency of 2.45 GHz.

4. The generator as defined in claim 3, wherein said microwave energy is excited in said slow wave structure at π mode.

5. The generator as defined in claim 2, wherein said slow wave structure has n number of periods, with n being a positive integer.

6. The generator as defined in claim 5, wherein said slow wave structure has 12 periods.

7. The generator as defined in claim 5, wherein said periods of slow wave structure are arranged in a series of half period, n−1 period and half period.

8. The generator as defined in claim 5, wherein said periods of said slow wave structure are 4.9 cm; wherein said upright height of said vertical vanes is 1.35 cm; and wherein said distance between two adjoining vertical vanes is 3.92 cm.

9. The generator as defined in claim 2, wherein said upright height of said vertical vanes of said surface wave resonant cavity mechanism is adjustable such that resonance frequency can be adjusted.

10. The generator as defined in claim 9, wherein said surface wave resonant cavity mechanism consists of a plurality of interval strips which are fastened equidistantly with said surface of said flat plate, a slide slot formed in said interval strips, said inlet plate, and said tail end plate, said mechanism further consisting of a slide plate and an adjustment mechanism, said slide plate being slidably disposed in said slide slot such that said slide plate is perpendicular to said surface of said flat plate, said adjustment mechanism being intended to adjust a vertical distance between said slide plate and said flat plate; and wherein said vertical vanes are disposed one by one in intervals formed by said interval strips such that said vertical vanes are fastened with said slide plate, and that an upright height between said vertical vanes and said surface of said flat plate can be adjusted by said adjustment mechanism.

11. The generator as defined in claim 10, wherein said adjustment mechanism consists of a threaded rod and a nut engageable with said threaded rod; and wherein said flat plate is provided with a through hole for receiving said threaded rod such that one end of said threaded rod is fastened with said slide plate, and that another end of said threaded rod is engaged with said nut which is rotatably confined by a stopping plate located at a distance away from said flat plate.

12. The generator as defined in claim 1 further comprising a microwave coupler provided at one end thereof with a couple port covering said couple hole of said inlet plate for guiding said microwave energy into said couple hole of said inlet plate from a microwave energy source located at another end of said microwave coupler.

13. The generator as defined in claim 12, wherein said couple hole of said inlet plate is rectangular in shape and has two opposite sides parallel to said surface of said flat plate; and wherein said microwave coupler has a waveguide tube having a rectangular cross section and an inclined inner wall, said rectangular cross section having a height which is gradually reduced toward said couple port such that said couple port is substantially equal in size to said couple hole of said inlet plate.

14. The generator as defined in claim 12 further comprising said microwave energy source which is capable of generating a microwave having a frequency of 2.45 GHz.

15. The generator as defined in claim 13, wherein said two opposite sides of said rectangular couple hole are separated by a distance of 1.0 cm, with another two opposite sides of said rectangular couple hole being separated by a distance of half wavelength.

16. The generator as defined in claim 13, wherein said upright height of said vertical vanes is greater than a distance between said surface of said flat plate and a side of said couple hole farthest from said surface of said flat plate.

17. The generator as defined in claim 16, wherein said upright height of said vertical vanes is equal to said distance between said surface of said flat plate and a side of said couple hole farthest from said surface of said flat plate.

18. The generator as defined in claim 1 further comprising a microwave radiation shield mechanism circumventing said surface wave resonant cavity mechanism.

19. The generator as defined in claim 18, wherein said microwave radiation shield mechanism consists of four metal plates which are arranged to form a rectangular wall surrounding said vertical vanes, said inlet plate and said tail end plate, with two opposite metal plates of said four metal plates being provided with a plurality of ventilation holes.

20. The generator as defined in claim 1, wherein said couple window is made of a material of a low microwave energy consumption and is formed of one piece or more pieces arranged side-by-side.

21. The generator as defined in claim 20, wherein said material is quartz or ceramics.

22. The generator as defined in claim 21, wherein said material is quartz.

23. The generator as defined in claim 19 further comprising an air conditioning mechanism for providing cooling air through said plurality of ventilation holes.

* * * * *